(12) United States Patent
Fisher et al.

(10) Patent No.: US 6,177,146 B1
(45) Date of Patent: Jan. 23, 2001

(54) DENSIFICATION OF A POROUS STRUCTURE (III)

(75) Inventors: Ronald Fisher, Warwickshire; Keith Williams, Coventry, both of (GB)

(73) Assignee: Dunlop Limited, Coventry (GB)

( * ) Notice: Under 35 U.S.C. 154(b), the term of this patent shall be extended for 0 days.

(21) Appl. No.: 09/202,691

(22) PCT Filed: Jun. 20, 1997

(86) PCT No.: PCT/GB97/01606

§ 371 Date: Dec. 21, 1998

§ 102(e) Date: Dec. 21, 1998

(87) PCT Pub. No.: WO97/48662

PCT Pub. Date: Dec. 24, 1997

(30) Foreign Application Priority Data

Jun. 20, 1996 (GB) .................................. 9612882

(51) Int. Cl.[7] .................................... G23C 16/26
(52) U.S. Cl. .................. 427/544; 427/543; 427/587; 427/591; 427/255.12; 427/249.2; 428/137; 428/293.4; 428/294.4; 428/408; 428/66.2
(58) Field of Search ............................... 427/543, 255.12, 427/249.2, 544, 587, 591; 428/137, 294.4, 293.4, 408, 66.2

(56) References Cited

U.S. PATENT DOCUMENTS

| | | | |
|---|---|---|---|
| 4,472,454 | 9/1984 | Houdayer et al. | 427/45.1 |
| 4,580,524 | 4/1986 | Lackey, Jr. et al. | 118/725 |
| 4,976,899 | 12/1990 | Rousseau et al. | 264/295 |
| 5,348,774 | 9/1994 | Golecki et al. | 427/543 |
| 5,378,879 * | 1/1995 | Monovoukas | 219/634 |
| 5,389,767 | 2/1995 | Dobry | 219/730 |
| 5,412,185 | 5/1995 | Sturman, Jr. et al. | 219/651 |

FOREIGN PATENT DOCUMENTS

| | | |
|---|---|---|
| 503794 A1 | 9/1992 | (EP) . |
| 0 592 239 | 4/1994 | (EP) . |
| 1221852 | 2/1971 | (GB) . |
| 2130567 | 6/1984 | (GB) . |
| 2268485 | 6/1994 | (GB) . |
| 3-64475 | 3/1991 | (JP) . |
| WO94/24837 | 10/1994 | (WO) . |

* cited by examiner

Primary Examiner—Shrive Beck
Assistant Examiner—Kirsten A. Crockford
(74) Attorney, Agent, or Firm—Young & Thompson

(57) ABSTRACT

A method for the densification of an annular body having a porous structure and comprising layers of fabric, which includes locating a susceptor element within the porous body, the amount of the susceptor element occupying less than 5% of the volume of the porous body, the susceptor element being in the form of a layer comprising one of a foil and a fiber and having plural holes therein through which adjacent layers of fabric of the porous body contact each other, said susceptor element being made of a material which is more susceptible to heating by electromagnetic radiation than the material of the porous body, and exposing the porous body to hydrocarbon gas and simultaneously applying an electromagnetic field to the porous body, the susceptor element within the porous body at least in part causing heating of the porous body to a temperature at which the gas infiltrating the porous body deposits carbon within the porous body.

33 Claims, 1 Drawing Sheet

DENSIFICATION OF A POROUS STRUCTURE (III)

This invention relates to a method for the densification of a porous structure, a porous structure for densification by the method of the invention and a densified structure, such as a friction element for an aircraft brake, formed by the method of the invention.

The invention relates generally but not exclusively to the infiltration and densification of a porous structure, such as a carbon fibre or ceramic structure, which may be shaped as a preform for a finished product or for use in providing a finished product.

It is known that in the manufacture of a carbon-carbon composite product, such as a brake friction element, a porous preform body, which may have approximately the desired shape and dimensions of the finished product, may be densified by a method which involves chemical vapour infiltration and deposition. The carbon-carbon composite product so formed has many useful attributes, including high strength and frictional wear resistance, but the use of such structures is limited by high costs which arise because of the slowness of the manufacturing method. Similar considerations arise in relation to the manufacture and use of other, ceramic matrix composites.

Carbon—carbon composites often are manufactured by the isothermal, isobaric chemical vapour infiltration (CVI) procedure whereby a hydrocarbon gas is caused to diffuse into a porous carbon fibre preform body and deposit carbon. To obtain a high final density and a desired microstructure the diffusion and deposition process is performed in a high temperature environment at a low pressure and takes a considerable period of time, for example typically between 500 and 2000 hours.

It is known that the rate of infiltration and deposition may be accelerated by a so-called thermal gradient technique. A temperature gradient is established within a preform and a front of deposition moves through the preform, starting at the hottest region and moving away progressively with increasing densification of the hottest region. The thermal gradient technique is discussed in U.S. Pat. No. 5,348,774 (Golicki) which describes a method of achieving a thermal gradient by the electromagnetic heating of a graphite core provided as a close fit in the bore of a porous preform body of annular shape.

Although the thermal gradient technique can accelerate the rate of infiltration and deposition, it requires the use of special equipment and process control procedures the cost of which tends to offset savings from the reduction of processing time.

Another prior art method and apparatus for densification of a porous body is described in EP 0 592 239 A2. In contrast to the use of a vapour for densification, as described in U.S. Pat. No. 5,348,774, the teaching of this publication relates to the use of a liquid for densification.

An object of the present invention is to provide an improved method for the densification of a porous structure, a porous structure for densification by the method of the invention and a densified structure formed by the method of the invention.

In accordance with one of its aspects the present invention provides a method for the densification of an annular porous structure comprising providing the structure with an annular body of a material which includes a susceptor element which occupies less than 5% of the volume of the porous structure and is more susceptible to heating by electromagnetic radiation than the material of the body, exposing said porous structure to hydrocarbon gas and simultaneously applying an electromagnetic field to said porous structure whereby said susceptor element at least in part causes heating of the porous structural to a temperature at which the gas infiltrating the porous structure deposits carbon within the porous structure.

The present invention provides also an annular porous structure for densification by chemical vapour infiltration, said porous structure comprising an annular body which includes a susceptor element which is more susceptible to heating by electromagnetic radiation than the material of the body, said susceptor element being positioned and arranged whereby when exposed to an electromagnetic field at least in part it causes heating of the porous structure to a temperature at which the gas infiltrating the porous structure deposits carbon within the porous structure.

The susceptor element may be an element of good electrical conductivity as hereinafter defined. It may be of a material which remains in the composite porous structure following densification, or it may be a material which is removed, for example by heating and melting or evaporating, or by cutting and/or machining of the composite structure.

If the susceptor element is to remain in the composite structure following densification, preferably it and other materials of the structure are selected to be materials which do not degrade or react with one another.

Although the invention teaches that only a single susceptor element need be incorporated in the porous structure it is envisaged that a plurality of said elements may be provided. The plurality may be arranged to lie coplanar and/or to lie in superimposed layers. Elements may be directly superimposed, optionally with porous structure material therebetween, or lie offset relative to one another.

In the case of a susceptor element of foil material it is taught by the present invention that the susceptor element foil may be annular and be incorporated in the porous structure such that the foil and porous structure are substantially concentric. The or at least one annular susceptor element foil may be positioned to lie substantially centrally between radially inner and outer extremities of the porous structure and/or substantially centrally between annular end faces of the porous structure.

The foil preferably has a thickness less than 1.0 mm, more preferably 0.5 mm or less.

It is further preferred that in the case of a porous structure formed from cloth layers, the ratio of the thickness of the foil to the thickness of each cloth layer is not greater than 2:1, preferably less than 1:1 and more preferably less than 0.5:1.

In the case of a susceptor element of fibres it is taught by the present invention that a susceptor element of fibres integrated as a layer may also be of annular shape and incorporated in the porous structure such that the susceptor element and porous structure are substantially concentric. The or at least one susceptor element layer may be positioned to lie substantially centrally between radially inner and radially outer extremities of the porous structure and/or substantially centrally between annular end faces of the porous structure.

The or each layer of susceptor element fibres preferably has a thickness less than 2.0 mm, preferably 1.0 mm or less. It is further preferred that in the case of a porous structure formed from cloth layers, the ratio of the thickness of a layer of susceptor element material to the thickness of each cloth layer is not greater than 3:1, preferably less than 1.5:1, and more preferably less than or equal to 1:1.

In the case of a susceptor element comprising fibres, the fibres may be individually dispersed within the porous body or a plurality of fibres may be integrated, for example as a woven or non-woven fabric layer, which is then incorporated within the porous body. Whether individually dispersed or incorporated in at least one fabric layer, or e.g. as a foil, the susceptor element material may be selectively positioned so that susceptor element material is present to a greater extent in one part of the porous body than in the remainder or another part of the porous body.

The susceptor element(s) may be arranged within the porous structure to provide a substantially uniform heating effect or the element(s) may be arranged in a non-uniform manner which results in a thermal gradient. By selecting the uniformity or otherwise of the heating effect there may be achieved a pre-selected uniformity or variation of rate of carbon deposition within the porous body.

In this specification the reference to a susceptor element of good electrical conductivity means an element of a material having a resistivity, expressed in units of micro ohm m, of less than 20, preferably less than 10, and more preferably less than 5. It is preferred also that a susceptor element of good conductivity shall have a resistivity greater than 0.02, preferably greater than 0.05 and more preferably more than 0.1 micro ohm m.

The resistivity of the susceptor element material preferably is less than, more preferably less than one half, that of the porous body material.

A susceptor element of good electrical conductivity may be of a kind, such as a fibre of constant cross-section, which is uniformly heated when exposed to an electromagnetic field. Alternatively the element may be of a kind which attains a temperature gradient when exposed to an electromagnetic field, for example as a result of being of a non-uniform resistance.

The frequency of the electromagnetic field is chosen in known manner to result in preferential heating of the susceptor element(s).

The shape (and/or orientation) of a susceptor element preferably also is selected to result in a preferential/efficient heating effect. To achieve a good heating effect when using a susceptor element of good electrical conductivity it is preferred typically that the element is in the form of an electrically conductive closed loop, e.g. of an annular form.

A porous structure may incorporate a single annular susceptor element of good electrical conductivity or a plurality of said elements. A plurality of elements may be arranged superimposed in a concentric manner, or may be spaced from one another, and/or may be of different radial dimensions.

An element of good electrical conductivity, or other type of susceptor element, whether of annular or other shape, may be comprised by a conductive foil, such as a metal foil or similar sheet material, which optionally may be of a perforated or mesh type, or it may be comprised by fibres, e.g. fibres of good electrical conductivity or a combination of any of said materials. Susceptor element fibres may, for example, be in the form of tows which optionally may be in the form of a fabric. The fibre tows or fabric may be formed substantially only from fibres of good electrical conductivity or from a combination which includes other materials such as ceramic or carbon fibres.

If the susceptor element is of sheet type material it may comprise apertures or cut-outs that allow formation of a bond between portions of other material between which the element is sandwiched, e.g. by bridging of the matrix material or by needle punching of fibres. Alternatively or additionally a susceptor element of sheet type material may lie embedded in the porous structure such that at least one edge region is covered by porous structure material which thereby interconnects porous structure material lying to each side of the susceptor element.

Suitable materials for a susceptor element include graphite, steel, tungsten and molybdenum.

An example of a procedure of the present invention for the manufacture of an annular carbon-carbon composite comprises making an annular preform of PAN (polyacrylonitrile) precursor carbon fibres which are heat treated to less than graphitisation temperature, typically in the order of 1500° C., and incorporating in the preform a concentric susceptor annulus of graphite foil. An example of a suitable foil is Sigrafoil which is marketed by SGL. When heated in a high frequency electromagnetic field the graphite foil rapidly heats by induction while the lower electrical conductivity carbon fibres remain cool. Subsequently the carbon fibres are subject to heating by thermal conduction from the hot graphite foil.

A porous preform may be constructed, for example, by arranging layers of fabric to be compressed in a jig, or bonding layers to one another with resin, or bonding layers with carbon or other material which will resist the temperature of deposition, or by needling together layers of fibres or fabric. The preform may be a multi-directional woven structure such as a three-dimensional woven structure.

The invention provides that in the case of carbon fibre it is possible to construct a major part of the preform from acrylic precursor fibre and to incorporate one or more loops of more graphitic, i.e. electrically conductive, fibres such as Amoco P55 or P120, which may be provided either in a fabric construction or laid between layers of the preform.

The porous structure material typically may have a thermal conductivity of less than 20 $Wm^{-1}K^{-1}$, a preferred range being 8 to 15 $Wm^{-1}K^{-1}$. The susceptor element material may have a thermal conductivity of greater than 50 $Wm^{-1}K^{-1}$. Preferably the conductivity is greater than 100 $Wm^{-1}K^{-1}$. Preferably the ratio between the thermal conductivity of the material of the susceptor element and that of the porous structure is at least 5:1, more preferably at least 10:1.

The susceptor element material preferably occupies less than 1% of the volume of the porous body, more preferably less than 0.5%.

As understood by those skilled in the art, there is a range of gases, liquids or vapours which can be used as the depositing medium. For carbon deposition a readily available and low cost medium is natural gas or methane, but any hydrocarbon may be used. Examples of materials for the deposition of silicon carbide, e.g. methyl trichlorosilane, are well known. In a technique described in U.S. Pat. No. 4,472,454 an annular carbon fibre preform is immersed in a liquid hydrocarbon and electromagnetic heating is employed in combination with a cylindrical susceptor which comprises a graphite mandrel arranged to extend within and to be in thermal contact with the bore of the preform. By use of a preform of a kind provided by the present invention it is possible to eliminate the need for a close-fitting graphite mandrel and the limitations which that imposes.

In accordance with a further of its aspects the present invention provides a method for the densification of a porous structure comprising providing the structure with a body of a material which includes a susceptor element which occupies less than 5% of the volume of the porous body and which is more susceptible to heating by electromagnetic radiation than the material of the body, exposing said porous structure to hydrocarbon gas and simultaneously applying an electromagnetic field to said porous structure whereby said susceptor element at least in part causes heating of the porous structure to a temperature at which the gas infiltrating the porous structure deposits carbon within the porous structure. The present invention further provides also a porous structure for densification by chemical vapour infiltration, said porous structure comprising a body which includes a susceptor element which occupies less than 5% of the volume of the porous body and which is more susceptible to heating by electromagnetic radiation than the material of the body, said susceptor element being positioned and arranged whereby when exposed to an electromagnetic field at least in part it causes heating of the porous structure to a temperature at which the gas infiltrating the porous structure deposits carbon within the porous structure. The susceptor element preferably occupies less than 1%, and more preferably less than 0.5% of the volume of the porous body.

It is envisaged that the method and product defined in the preceding paragraph may be used in combination with any one or more of the other features described herein.

The invention is advantageous for the manufacture of a product such as an aircraft carbon composite brake disc which is required to be especially strong at an edge region, such as a notched edge region which can engage keyways for the transmission of braking torque. The invention provides an efficient route for achieving a high density in an edge region.

An embodiment of the invention as applied to an aircraft brake disc is now described by way of example only, reference being made to the drawings, in which.

Figure 1:
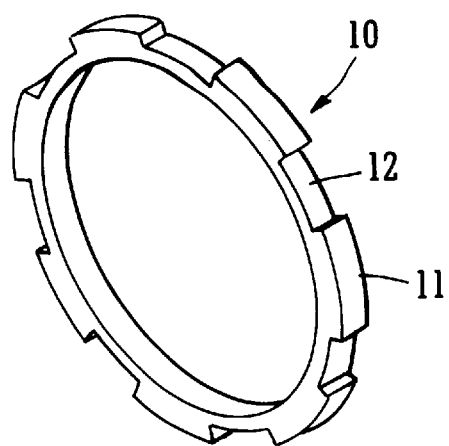
FIG. 1 is a perspective view of a brake disc.

An aircraft brake disc 10 as shown in FIG. 1 has an outer edge 11 provided with circumferentially spaced notches 12 for engaging with the internal splines of an aircraft wheel. The present invention teaches that in the example of this particular embodiment the edge region 11 is to be given a higher density than other parts of the disc by providing that in a preform for manufacture of the disc that region shall have a greater proportion of elements of good electrical conductivity than other parts of the disc. The higher density at the edge region 11 results in a higher strength which is needed for transmission of torque loads.

Figure 3:
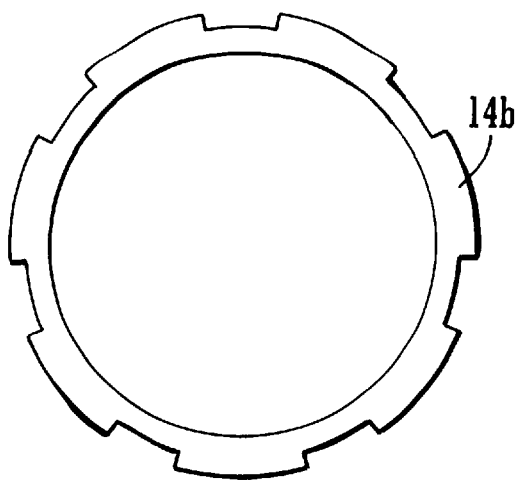
FIG. 3 is a side view of a component layer of the preform of FIG. 2.
Figure 2:
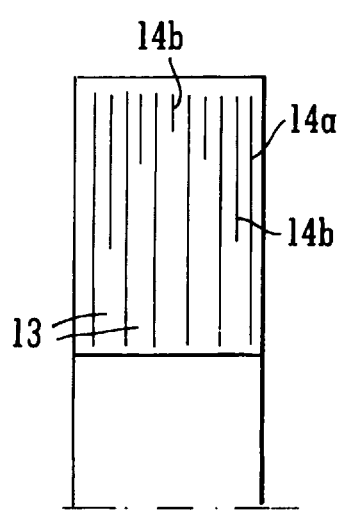
FIG. 2 is a transverse section of part of a preform for the disc of FIG. 1.

The preform for the disc 10 comprises layers of carbon fibre preform material 13 (see FIG. 2) of known kind and which conventionally has a low electrical conductivity. That material incorporates layers 14 of Sigrafoil, some layers 14a extending between inner and outer radial edges of the disc preform and alternating with other foil layers 14b which lie only at a radially outer edge. For the manufacture of a disc which is pre-formed with notches, or which has lower density regions for removal by machining to form notches, the foil layers have notched outer profiles as shown by FIG. 3.

Following electromagnetic heating of the foil during a carbon infiltration and densification process the resulting disc has greater strength in the notched drive regions, and that can be achieved without adversely affecting the desired physical properties of the disc friction surfaces. The use of the good electrically conductive material within the preform allows heat to be generated within the preform instead of being conducted to the preform. This results in a beneficial reduction of manufacturing time and cost.

In some applications it may be preferred to avoid a high densification at edge regions, in which case the susceptor material is positioned primarily at positions remote from the edges.

The invention has been illustrated in the context of a rotor disc but may be applied also to the manufacture of a stator disc.

The significant effect of the susceptor material provided within a preform for the purpose of generating heat is illustrated by the results of two test examples described below and conducted respectively on preforms without and with elements of good electrical conductivity.

EXAMPLE 1

A solid, non-apertured disc 50 mm in diameter and 25 mm thickness was laid up from non-woven fabric produced from oxidised acrylic fabric needle punched and carbonised by heating in an inert atmosphere at 1025° C.

The preform was placed in a transparent silica tube with a flow of nitrogen gas and an induction coil placed around the tube. A generator operating at a frequency of 450 kHz passed a current around the coil and the preform was viewed with an optical pyrometer. After 5 minutes no temperature increase was measured.

EXAMPLE 2

A preform was produced as in Example 1 with an annulus of graphite foil at mid thickness. The annulus was 50 mm outside diameter and 25 mm inner diameter.

The preform was subjected to the induction coil as in Example 1 and the temperature at the edge of the graphite foil was measured at 1100° C. in 1 minute. The remainder of the preform did not show any measurable temperature increase.

The invention allows for better control of deposition of carbon in addition to a faster deposition rate. Thus it is possible to achieve a better deposition density at the centre of a preform, and to avoid the low density problems experienced at the centre of thick preforms as seen with isothermal, isobaric carbon vapour impregnation.

The invention also allows substantial ease of flexibility in control of densification so as to achieve a desired thermal gradient deposition appropriate to a specific product requirement.

What is claimed is:

1. A method for the densification of an annular body having a porous structure and comprising layers of fabric, the method comprising the steps of:

locating a susceptor element within the porous body, the amount of the susceptor element occupying less than 5% of the volume of the porous body, the susceptor element being in the form of a layer comprising one of a foil and a fiber and having plural holes therein through which adjacent layers of fabric of the porous body contact each other, said susceptor element being made of a material which is more susceptible to heating by electromagnetic radiation than the material of the porous body; and exposing the porous body to hydrocarbon gas and simultaneously applying an electromagnetic field to the porous body, the susceptor element within the porous body at least in part causing heating of the porous body to a temperature at which the gas infiltrating the porous body deposits carbon within the porous body.

2. The method according to claim 1, wherein the resistivity of the susceptor element material is less than that of the porous body.

3. The method according to claim 2, wherein the resistivity of the susceptor element material is less than one half that of the porous body.

4. The method according to claim 1, wherein said susceptor element occupies less than 1% of the volume of the porous body.

5. The method according to claim 4, wherein said susceptor element occupies less than 0.5% of the volume of the porous body.

6. The method according to claim 1, wherein said layer comprises a layer of electrically conductive foil.

7. The method according to claim 1, wherein said layer comprises a layer of fibers.

8. The method according to claim 7, wherein said fibers are in the form of filaments arranged as one of a tow, a yarn and a cord.

9. The method according to claim 1, wherein a ratio of a thickness of a layer of susceptor element material to a thickness of each of the layers of fabric in the porous body is not greater than 2:1.

10. The method according to claim 1, wherein a ratio of a thickness of a layer of susceptor element material to a thickness of each of the layers of fabric in the porous body is not greater than 3:1.

11. The method according to claim 1, wherein the susceptor element is in the form of an electrically conductive closed loop.

12. The method according to claim 11, wherein the susceptor element is of annular form.

13. The method according to claim 12, wherein the annular susceptor element is arranged to lie substantially concentric with the porous body.

14. The method according to claim 12, wherein the susceptor element of annular shape is positioned to lie substantially centrally between radially inner and outer extremities of the porous body.

15. The method according to claim 12, wherein the susceptor element is positioned to lie substantially centrally between annular end faces of the porous body.

16. The method according to claim 1, wherein the susceptor element comprises an electrically conductive foil and at least one edge region of the foil is covered by the material of the porous body which is arranged to interconnect the porous body material lying to each side of the foil.

17. The method according to claim 1, wherein the susceptor element comprises an electrically conductive foil in combination with fibers that also act as susceptor elements.

18. The method according to claim 1, wherein a ratio between the thermal conductivity of the susceptor element material and the porous body material is at least 5:1.

19. The method according to claim 1, further comprising the step of keeping the susceptor element in the composite porous structure following densification.

20. The method according to claim 1, wherein the porous body comprises a plurality of superimposed annular elements of good electrical conductivity.

21. The method according to claim 1, wherein a plurality of the susceptor elements are arranged to provide a thermal gradient when the porous body is exposed to the electromagnetic field.

22. The method according to claim 1, further comprising the steps of forming the porous body by one of arranging the layers of fabric to be compressed in a jig, bonding layers to one another with a resin, bonding layers with a material which will resist the temperature of deposition, and by needling together the layers of fabric.

23. The method according to claim 1, wherein the porous body is a multi-directional woven structure.

24. A densified porous structure manufactured by a method according to claim 1.

25. The densified structure according to claim 24, wherein the structure is that of or for an aircraft carbon composite disc brake.

26. A porous structure for densification by chemical vapor infiltration, said porous structure comprising:

plural layers of fabric forming a body; and a susceptor element within said body which occupies less than 5% of the volume of the porous structure and which is more susceptible to heating by electromagnetic radiation than the material of the body, said susceptor element comprising a foil or fiber layer having plural holes therein through which adjacent layers of fabric of said body contact each other, said adjacent layers of fabric being joined by one of being bonding through said holes and being needle punched through said holes in said foil or fiber layer, said susceptor element being positioned and arranged so that when exposed to an electromagnetic field it causes, at least in part, heating of the porous structure to a temperature at which the gas infiltrating the porous structure deposits carbon within the porous structure.

27. The porous structure according to claim 26, wherein said susceptor element occupies less than 1% of the volume of the porous structure.

28. The porous structure according to claim 26, wherein the porous structure is annular arid comprises at least one annular layer of electrically conductive foil arranged to lie substantially coaxially with the porous structure.

29. The porous structure according to claim 26, wherein a ratio between the thermal conductivity of the susceptor element material and that of the body is at least 5:1.

30. A method of increasing the density of an annular body made of a multilayered porous material comprised of layers of fabric, comprising the steps of:

laminating a plurality of annular susceptor elements among the layers of the porous material of the annular body so that each of the susceptor elements is completely surrounded by an adjacent pair of the layers of the porous material of the annular body, a volume of the susceptor elements being less than 5 percent of a volume of the annular body, each of the susceptor elements having plural holes therein through which adjacent layers of fabric of the porous body contact each other and being one of a foil less than one millimeter thick and a fabric layer less than two millimeters thick and being made of a material that is more susceptible to heating by electromagnetic radiation than the porous material of the annular body; and exposing the annular body to hydrocarbon gas and simultaneously applying an electromagnetic field to the annular body so the susceptor elements inside the porous material of the annular body heat the porous material of the annular body to a temperature at which the hydrocarbon gas deposits carbon inside the porous body to increase its density.

31. The method claim 30, wherein the multilayered porous material is formed by laminating plural cloth layers.

32. The method of claim 31, wherein the susceptor elements are foils no more than one-half millimeter thick.

33. The method of claim 30, wherein more of the susceptor elements are in one portion of the annular body than another portion.

* * * * *